United States Patent
Tsang et al.

(10) Patent No.: US 10,250,240 B2
(45) Date of Patent: Apr. 2, 2019

(54) INTEGRATED CIRCUIT COMPRISING CIRCUITRY TO CHANGE A CLOCK SIGNAL FREQUENCY WHILE A DATA SIGNAL IS VALID

(71) Applicant: Rambus Inc., Sunnyvale, CA (US)

(72) Inventors: Brian Hing-Kit Tsang, Fremont, CA (US); Jared L. Zerbe, Woodside, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/823,226

(22) Filed: Nov. 27, 2017

(65) Prior Publication Data

US 2018/0175837 A1   Jun. 21, 2018

Related U.S. Application Data

(60) Continuation of application No. 15/015,917, filed on Feb. 4, 2016, now Pat. No. 9,893,720, which is a division of application No. 14/050,107, filed on Oct. 9, 2013, now Pat. No. 9,299,408.

(60) Provisional application No. 61/715,767, filed on Oct. 18, 2012.

(51) Int. Cl.
| | |
|---|---|
| *G11C 11/16* | (2006.01) |
| *H03K 5/133* | (2014.01) |
| *G11C 8/18* | (2006.01) |
| *H03L 7/00* | (2006.01) |
| *G11C 7/10* | (2006.01) |
| *G11C 7/22* | (2006.01) |
| *G06F 13/16* | (2006.01) |
| *H03K 3/03* | (2006.01) |
| *H03K 7/06* | (2006.01) |
| *H01L 43/08* | (2006.01) |
| *G11C 11/15* | (2006.01) |
| *H03K 5/00* | (2006.01) |

(52) U.S. Cl.
CPC ......... *H03K 5/133* (2013.01); *G06F 13/1689* (2013.01); *G11C 7/10* (2013.01); *G11C 7/1066* (2013.01); *G11C 7/22* (2013.01); *G11C 7/222* (2013.01); *G11C 8/18* (2013.01); *H03K 3/0315* (2013.01); *H03K 7/06* (2013.01); *H03L 7/00* (2013.01); *G11C 11/15* (2013.01); *G11C 11/16* (2013.01); *H01L 43/08* (2013.01); *H03K 2005/00019* (2013.01); *Y02D 10/14* (2018.01)

(58) Field of Classification Search
CPC .......... G11C 11/16; G11C 11/15; H01L 43/08
USPC .................................. 365/158, 201, 233.13
See application file for complete search history.

(56) References Cited

U.S. PATENT DOCUMENTS

| | | | | |
|---|---|---|---|---|
| 7,847,608 B2 * | 12/2010 | Redman-White | .... | G11C 7/1051 327/147 |
| 2011/0208990 A1 | 8/2011 | Zerbe et al. | | |

FOREIGN PATENT DOCUMENTS

WO   WO-2012-021380 A2   2/2012

* cited by examiner

*Primary Examiner* — Jason Lappas
(74) *Attorney, Agent, or Firm* — Park, Vaughan, Fleming & Dowler LLP; Laxman Sahasrabuddhe

(57) ABSTRACT

Methods and apparatuses for communicating information are described. In some embodiments, a first integrated circuit (IC) provides a clock signal and a data signal to a second IC, wherein the data bits of the data signal are timed according to the clock signal, and wherein the frequency of the clock signal is capable of being changed even when the data signal is valid.

20 Claims, 9 Drawing Sheets

A sampling receiver samples the data bit at a fixed delay offset from the data bit edge Time instances when a sampling receiver samples the data bits

INTEGRATED CIRCUIT COMPRISING CIRCUITRY TO CHANGE A CLOCK SIGNAL FREQUENCY WHILE A DATA SIGNAL IS VALID

RELATED APPLICATION

This patent application is a continuation of, and claims priority to, U.S. application Ser. No. 15/015,917, having the same title and inventors, filed on 4 Feb. 2016, the contents of which are herein incorporated by reference in their entirety for all purposes. U.S. application Ser. No. 15/015,917, is a divisional of, and claims priority to, U.S. application Ser. No. 14/050,107, having the same title and inventors, filed on 9 Oct. 2013; U.S. Pat. No. 9,299,408, issued 29 Mar. 2016), the contents of which are herein incorporated by reference in their entirety for all purposes. U.S. application Ser. No. 14/050,107 claims priority under 35 U.S.C. § 119 to U.S. Provisional Application No. 61/715,767, having the same title and inventors, filed on 18 Oct. 2012, the contents of which are herein incorporated by reference in their entirety for all purposes.

BACKGROUND

This disclosure generally relates to electronic circuits. The power consumption and the performance of an electronic circuit generally depend on the clock frequency at which the electronic circuit is operated. Specifically, decreasing the clock frequency decreases power consumption and performance. Conversely, increasing the clock frequency increases power consumption and performance. In complementary metal oxide semiconductor (CMOS) circuits the relationship between dynamic power consumption, capacitance, voltage, and switching frequency can be expressed as $P=C \cdot V^2 \cdot f$, where P is the dynamic power consumption, C is the capacitance, V is the voltage, and f is the switching frequency.

DETAILED DESCRIPTION

Figure 1A:
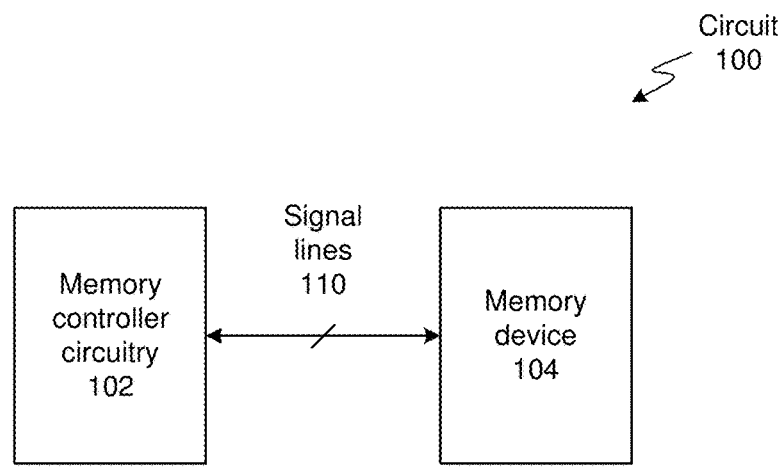
FIG. 1A illustrates a circuit in accordance with some embodiments described herein.

Some embodiments described herein feature a system comprising a first device and a second device, wherein the first device provides a clock signal and a data signal to the second device, wherein the data bits of the data signal are timed according to the clock signal, and wherein the frequency of the clock signal and the rate of data transmission is capable of being changed even when the data signal is valid.

Some embodiments described herein feature a memory system in which power consumption may be reduced by changing the clock frequency that is used for communicating information between memory controller circuitry and a memory device. In these embodiments, the memory controller circuitry provides a clock signal and a data signal to the memory device, wherein the bits of the data signal are timed according to the clock signal, and wherein the data signal encodes command information, address information, and/or data. When performing a read operation the memory device returns the clock signal that was received from the memory controller circuitry back to the memory controller circuitry (after the clock signal passes through one or more clock buffers in the memory device), and provides a data signal to the memory controller circuitry, wherein the bits of the data signal are timed according to the returning clock signal, and wherein the data signal encodes data that was requested by the memory controller circuitry and/or status information that indicates whether or not the memory command was performed successfully. In some embodiments described herein, the memory controller circuitry is capable of changing the clock frequency while the data signal is valid.

The term "data" refers to digital information, e.g., information that is typically represented by a set of bits. Examples of data include, but are not limited to, command information, address information, and the contents of a memory location. The term "data signal" refers to a time-varying voltage or current signal that is used for communicating data. A data word can be communicated by using multiple parallel data signals, wherein each data signal corresponds to one or more bits in the data word. Data is typically communicated in bursts. For example, memory controller circuitry may communicate two chunks of data to a memory device as follows: during a first continuous time period the memory controller circuitry communicates a first chunk of the data to the memory device, followed by a second continuous time period during which the memory controller circuitry does not communicate any data to the memory device, followed by a third continuous time period during which the memory controller circuitry communicates a second chunk of data to the memory device. A data signal is considered to be valid during a continuous time period during which the data signal encodes data (e.g., the first and third continuous time periods in the above example). The data signal is considered to be invalid during a continuous time period during which the data signal does not encode any data (e.g., the second continuous time period in the above example).

The data bits encoded in a data signal are timed according to a clock signal. Specifically, the source (e.g., memory controller circuitry) converts a sequence of data bits into a data signal in accordance with a clock signal (e.g., the transitions in the data signal are timed using the clock signal), and the destination (e.g., a memory device) converts the received data signal into the sequence of data bits in accordance with the clock signal (e.g., the data signal is sampled using the clock signal).

A data signal is communicated over a signal line. According to one definition, a signal line is an electrical connection (e.g., one or more wires) over which data can be communicated. Signal lines can be single-ended or differential, unidirectional or bidirectional, and can be used to communicate one or more clock signals, and/or one or more data signals that encode data. Different types of information (e.g., command information, address information, information that was read from or that is to be written to a memory device, etc.) can be communicated over different sets of signal lines (i.e., each set of signal lines carrying a specific type of information) or over the same set of signal lines.

FIG. 1A illustrates a circuit in accordance with some embodiments described herein. Circuit 100 includes memory controller circuitry 102 and memory device 104. Memory controller circuitry 102 communicates with memory device 104 over signal lines 110. An agent (e.g., a central processing unit) can access memory device 104 through memory controller circuitry 102. In some embodiments the agent and memory controller circuitry 102 reside on different devices, and in other embodiments the agent and the memory controller circuitry 102 reside on the same device (e.g., in a system-on-a-chip).

Memory device 104 is any integrated circuit (IC) whose primary function is the storage and retrieval of data. Examples of memory devices include, but are not limited to, a volatile memory IC (e.g., a dynamic random-access memory (DRAM) IC, a synchronous double data rate (DDR) DRAM IC, etc.), and a non-volatile memory IC (e.g., a flash memory IC).

Memory controller circuitry 102 is included on an integrated circuit die and can be any circuitry that is capable of controlling the operation of a memory device. An agent can be any circuitry that reads data from and/or writes data to memory device 104 through memory controller circuitry 102. Examples of agents include, but are not limited to, a central processing unit (CPU), a graphics processing unit (GPU), a network processor, a cryptographic accelerator, a peripheral controller, a display controller, a video codec, an audio codec, a direct memory access (DMA) controller, a digital signal processing (DSP) cores, hardware accelerators, or generally any circuitry that is designed to perform digital, analog, and/or mixed-signal functions.

In some embodiments described herein, an agent provides a memory command to memory controller circuitry 102. Memory controller circuitry 102 then provides a clock signal and a data signal to memory device 104 over signal lines 110, wherein the data signal is timed according to the clock signal. In some embodiments described herein, memory controller circuitry 102 is capable of changing the frequency of the clock signal and making a corresponding change in the data rate while the data signal is valid, and memory device 104 is capable of interpreting the data signal correctly even when the clock signal frequency and data rate is changed while the data signal is valid.

The data signals sent by memory controller circuitry 102 can encode one or more memory commands, address information, and/or data (e.g., for a write command). In one embodiment, during a read command memory device 104 sends a clock signal (which can be a delayed version of the clock signal that was received from memory controller circuitry 102) to memory controller circuitry 102 over signal lines 110. Memory device 104 also provides data signals to memory controller circuitry 102 over signal lines 110, wherein the data signals are timed according to the clock signal that is sent from memory device 104 to memory controller 102. If the memory command is a read command, the data signals can encode at least a part of the data that was requested by the read command. Memory controller circuitry 102 then provides the data received from memory device 104 and/or a status of the memory command to the agent. In some embodiments, memory controller 102 is capable of operating signal lines 110 at a higher or lower data rate than the data rate at which the memory controller circuitry 102 communicates with the agent. In such embodiments, memory controller circuitry 102, memory device 104, and/or the agent can accommodate different data rates by means of on-chip buffers to compensate for bursts of data at different data rates.

Figure 1B:
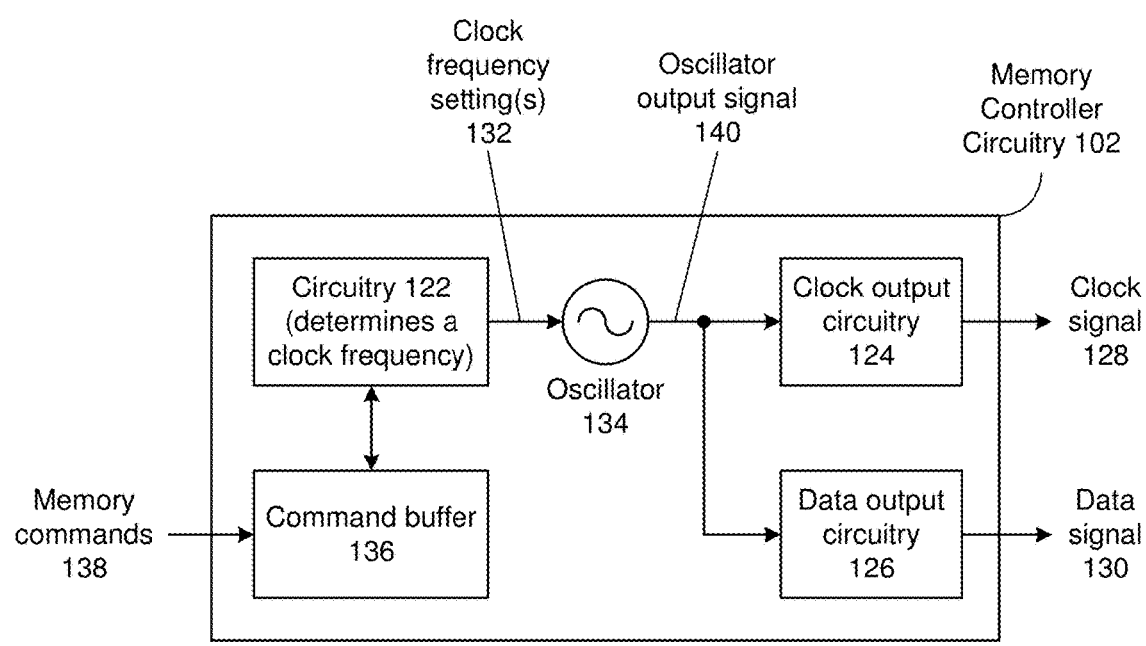
FIG. 1B illustrates an implementation of memory controller circuitry in accordance with some embodiments described herein.

FIG. 1B illustrates an implementation of memory controller circuitry 102 in accordance with some embodiments described herein.

Command buffer 136 stores memory commands 138 received from an agent. Memory commands 138 can be performed by memory controller circuitry 102 in a different order than the order in which they were received. Oscillator 134 outputs a clock signal having a clock signal frequency. This clock signal is then provided to clock output circuitry 124, which then outputs clock signal 128 onto one or more signal lines. The output from oscillator 134 is also provided to data output circuitry 126 which outputs data signal 130 onto a signal line (e.g., a single wire if the data signal is single-ended, or a pair of wires if the data signal is differential). Typically, multiple parallel data signals are outputted by data output circuitry 126 onto multiple signal lines.

Circuitry 122 can determine a target clock signal frequency based on a number of factors. Once a target clock signal frequency has been determined, circuitry 122 provides clock frequency setting(s) 132 that correspond to the target clock signal frequency to oscillator 134. Next, oscillator 134 changes its clock signal frequency to the target clock signal frequency. While oscillator 134 is changing the clock signal frequency, clock output circuitry 124 and data output circuitry 126 continue to operate as usual, i.e., clock output circuitry 124 continues to output clock signal 128 whose frequency changes as oscillator 134 changes its clock signal frequency, and data output circuitry 126 continues to output data signal 130 whose bits are timed according to clock signal 128 even when the clock frequency is changing.

In this manner, some embodiments described herein allow memory controller circuitry 102 to gaplessly (i.e., without interruption) adjust the frequency of a clock signal that is used to encode data bits into a data signal while the data signal is valid. This enables these embodiments to operate efficiently across different signal line utilizations because these embodiments do not incur additional latency and power while changing the clock frequency. In some embodiments described herein, the clock signal frequency can be changed gaplessly between any two frequencies in the range 0.5-3.2 GHz with a 0.035 GHz resolution.

Figure 1C:
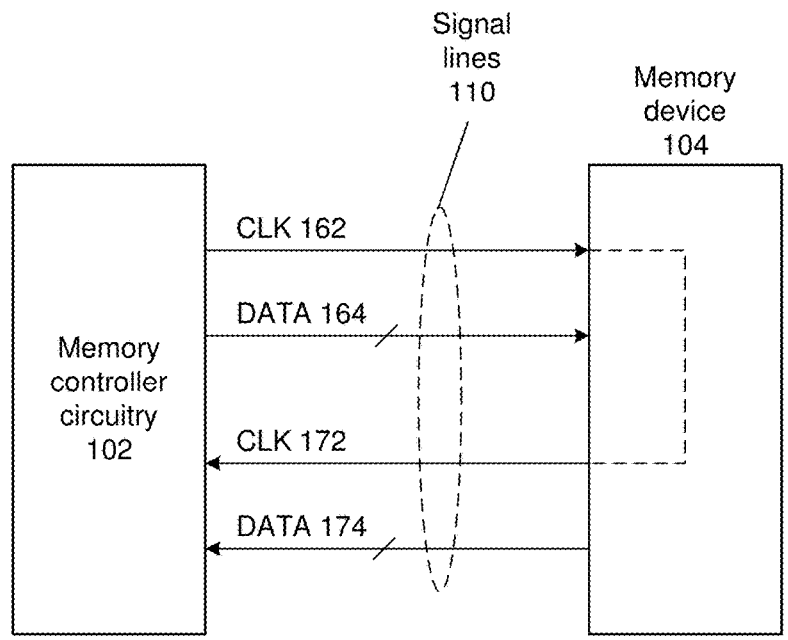
FIG. 1C illustrates an example of how a set of signal lines can be used to communicate information between memory controller circuitry and a memory device in accordance with some embodiments described herein.

FIG. 1C illustrates an example of how signal lines 110 can be used to communicate information between memory controller circuitry 102 and memory device 104 in accordance with some embodiments described herein.

Signal lines 110 can include clock signal line 162 and data signal line 164 that memory controller circuitry 102 uses to provide a clock signal and a data signal (which can encode a memory command or data), respectively, to memory device 104. Signal lines 110 also include clock signal line 172 and data signal line 174 that memory device 104 uses to provide a clock signal and a data signal, respectively, to memory controller circuitry 102. The clock signal outputted by memory device 104 on clock signal line 172 is a delayed version of the clock signal received by memory device 104 on clock signal line 162 (this is shown using a dashed line that is routed through memory device 104). In some embodiments, each signal line in FIG. 1C represents a pair of electrical connections that carry a differential signal.

Figure 1D:
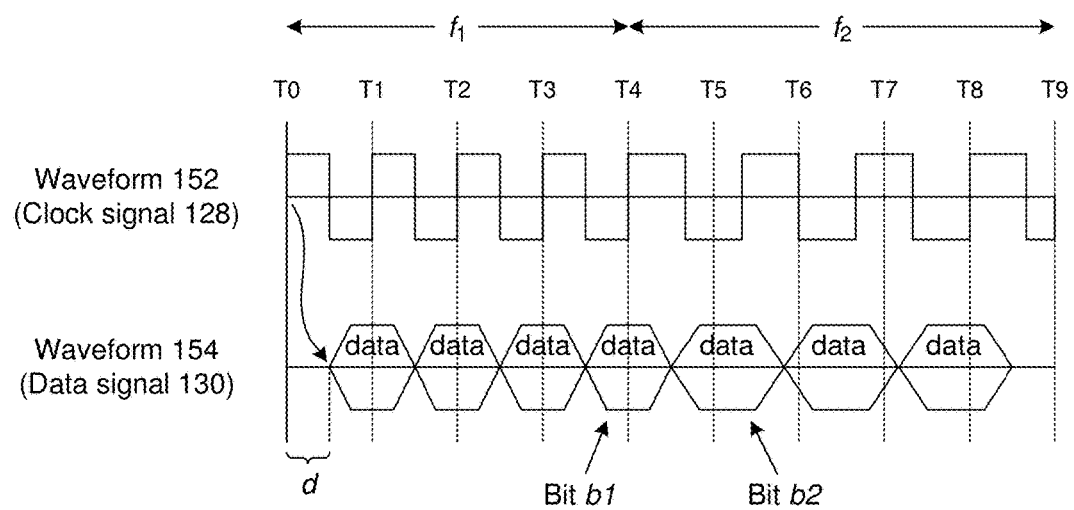
FIG. 1D illustrates some waveforms associated with the circuitry shown in FIG. 1B in accordance with some embodiments described herein.

FIG. 1D illustrates some waveforms associated with the circuitry shown in FIG. 1B in accordance with some embodiments described herein.

Waveform 152 corresponds to clock signal 128 and waveform 154 corresponds to data (which can encode a memory command or data) signal 130. As shown in FIG. 1D, the frequency of clock signal 128 decreases from $f_1$ to $f_2$ at time T4. However, data signal 130 is not interrupted during this frequency change. Instead, as shown in waveform 154, data signal 130 continues to output bits that are timed according to the changing clock frequency of clock signal 128. Specifically, bit b1 is outputted at a data rate corresponding to $f_1/2$ and the very next bit, b2, is outputted gaplessly at a data rate corresponding to $f_2/2$.

Since the output from oscillator 134 is provided to clock output circuitry 124 and data output circuitry 126, every data bit in data signal 130 corresponds to a particular clock edge in clock signal 128. Some embodiments described herein maintain this correspondence between the data bits of data signal 130 and the clock edges of clock signal 128 until the data bit is interpreted by a receiver. Because this correspondence is maintained, a receiver in memory device 104 can correctly interpret data signal 130 even when consecutive bits in data signal 130 are timed according to different clock frequencies.

In some embodiments described herein, clock signal 128 passes through one or more buffers in memory device 104 before the clock signal is used to interpret data signal 130. Data signal 130 also passes through one or more buffers in memory device 104 before it is interpreted. Typically, the delay of the clock signal path in memory device 104 is greater than the delay of the data signal path. In some embodiments described herein, the delays in clock output circuitry 124 and data output circuitry 126 in memory controller 102 are configured to cancel the difference in the delays that the clock signal and the data signal are expected to experience in memory device 104. In this manner, some embodiments described herein ensure that the correspondence between the clock edges of clock signal 128 and the data bits of data signal 130 are maintained until data signal 130 is interpreted using clock signal 128. For example, as shown in FIG. 1D, a delay "d" between clock signal 128 and data signal 130 can be introduced in memory controller circuitry 102 to ensure that a receiver in memory device 104 interprets a data bit in data signal 130 using the correct clock edge of clock signal 128.

Figure 2A:
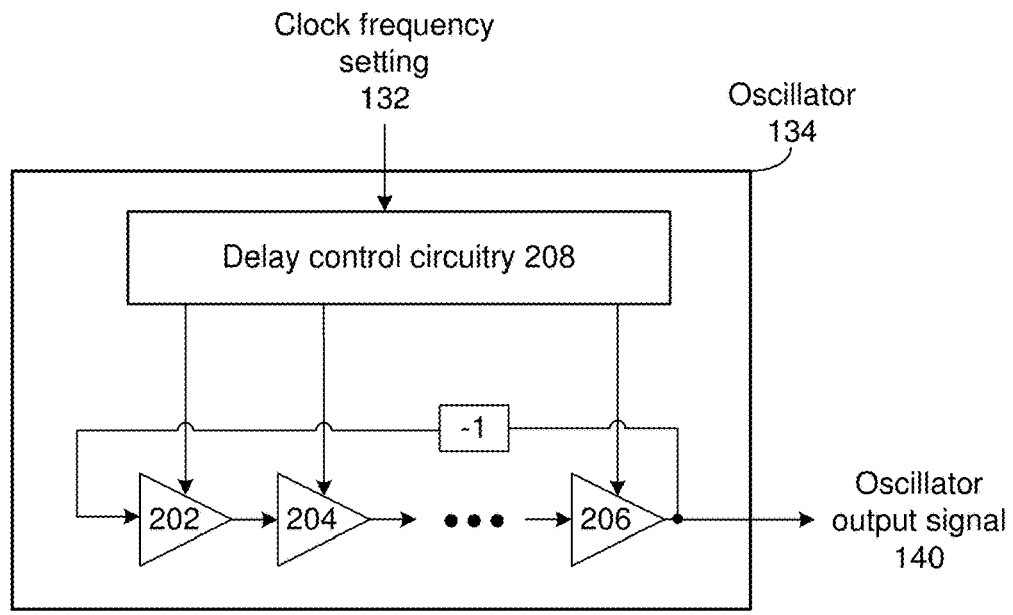
FIG. 2A illustrates an implementation of an oscillator in accordance with some embodiments described herein.

FIG. 2A illustrates an implementation of oscillator 134 in accordance with some embodiments described herein.

In some embodiments described herein, oscillator 134 is a ring oscillator that includes multiple delay elements 202-206 that are arranged in a loop. A delay element in the loop may or may not invert its input signal. However, to form an oscillating loop, an effective inversion of the signal is required. The fact that the loop inverts the signal is illustrated in the figures of this disclosure by using a rectangular box with a "−1" written inside the box. In some embodiments described herein, the rectangular box with a "−1" written inside the box represents the fact that the loop has an odd number of single-ended delay elements that invert the signal. In other embodiments, the rectangular box with a "−1" written inside the box represents the fact that the differential outputs of an odd number of differential delay elements are provided, with reverse polarity, to the next differential delay element in the loop.

The frequency of oscillator output signal 140 depends on the loop delay, i.e., the aggregate delay of delay elements 202-206. In some embodiments the delay of elements 202-206 set one phase of the resulting clock output (½ of the clock period). Clock frequency setting 132 is provided to delay control circuitry 208. The output from delay control circuitry 208 is provided to one or more delay elements in the loop to change their delays, thereby changing the frequency of oscillator output signal 140. In some embodiments, clock frequency setting 132 can be a binary value that corresponds to a target clock frequency, and delay control circuitry 208 may perform a table lookup to determine a corresponding control signal to provide to one or more delay elements.

Figure 2B:
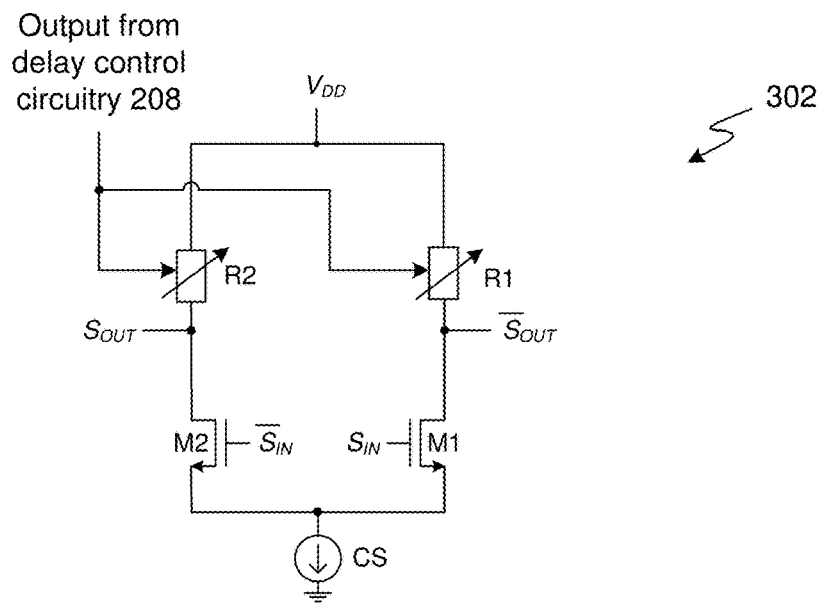
FIG. 2B illustrates an implementation of a delay element in accordance with some embodiments described herein.

FIG. 2B illustrates an implementation of a delay element in accordance with some embodiments described herein.

In the implementation shown in FIG. 2B, delay element 202 includes differential transistor pair M1 and M2 which receive a differential input signal at nodes $S_{IN}$ and $\overline{S}_{IN}$, and produce a differential output signal at nodes $S_{OUT}$ and $\overline{S}_{OUT}$. The differential output signal from delay element 202 can then be provided as a differential input signal to delay element 204.

The sources of transistors M1 and M2 are coupled to current source CS, and $V_{DD}$ is the supply voltage. The delay of a delay element (e.g., delay element 202) primarily depends on the RC product (i.e., the product of the resistance and the capacitance) at the output nodes (e.g., output nodes $S_{OUT}$ and $\overline{S}_{OUT}$). In some embodiments described herein, the output from delay control circuitry 208 is used to change the RC product, thereby changing the delay of the delay element(s). In general, the output from delay control circuitry 208 can be used to change the resistance, the capacitance, or both the resistance and the capacitance at the output nodes. In the implementation shown in FIG. 2B, the output from delay control circuitry 208 is provided as a control signal to variable resistances R1 and R2. A higher resistance value corresponds to a higher delay (which corresponds to a lower frequency), and a lower resistance value corresponds to a lower delay (which corresponds to a higher frequency).

Some embodiments of the receiver circuitry are now described. In some embodiments, the receiver circuitry in memory device 104 samples data signal 130 at a location in each data bit that is sufficiently far away from the edges of the data bit (this ensures that the bit-error rate is low).

Figure 3A:
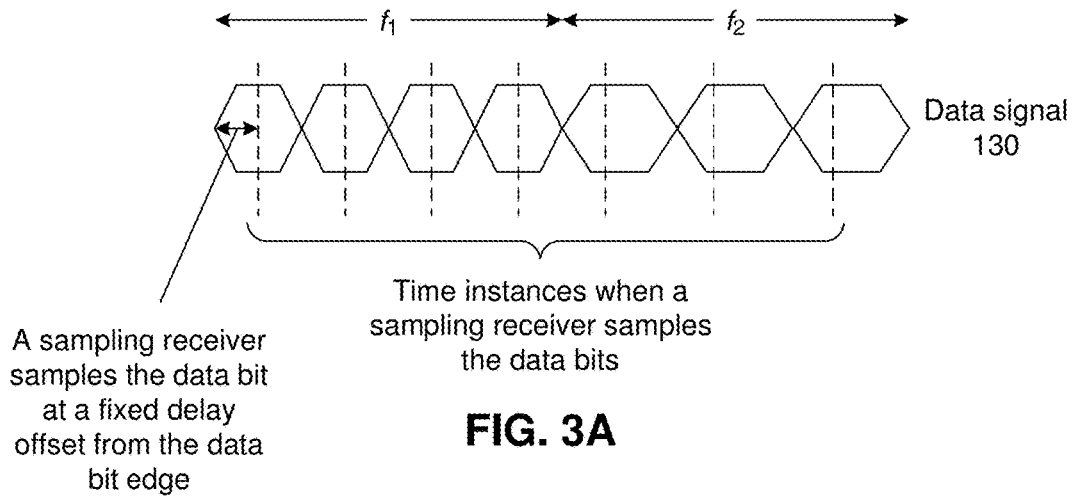
FIG. 3A illustrates a waveform that corresponds to a sampling receiver in accordance with some embodiments described herein.

Some embodiments use a sampling receiver that samples the data signal after a fixed delay with respect to the corresponding clock edge. FIG. 3A illustrates a waveform that corresponds to a sampling receiver in accordance with some embodiments described herein.

Of the seven data bits shown in FIG. 3A, the first four data bits of data signal 130 are timed according to a clock frequency $f_1$, and the remaining three data bits are timed according to a clock frequency $f_2$. The dashed vertical lines represent the time instances when the sampling receiver samples the data bits. As shown in FIG. 3A, a sampling receiver always samples a data bit at a fixed delay offset from the data bit edge (which in turn is at a fixed delay offset from the corresponding clock edge). The sampling location changes with respect to the edges of the data bits when the clock signal frequency is changed. For example, as shown in FIG. 3A, the sampling location is substantially in the middle of the data bit for the first four data bits, but the sampling location moves toward the left edge of the data bit when the clock frequency changes from $f_1$ to $f_2$.

Figure 3B:
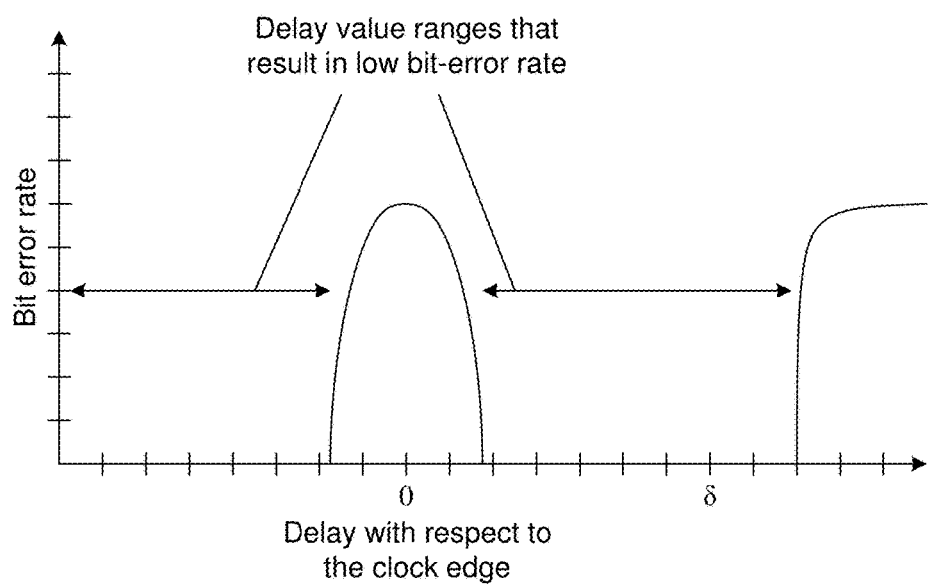
FIGS. 3B-3C illustrate plots of the bit-error rate for a low and a high clock frequency, respectively, versus the delay from the data bit edge in accordance with some embodiments described herein.
Figure 3C:
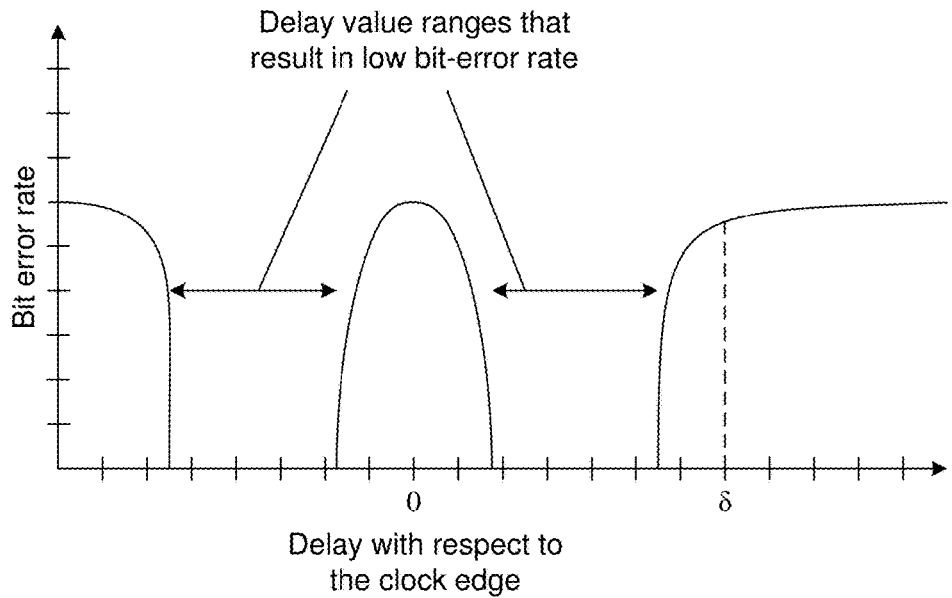
Figure 3D:
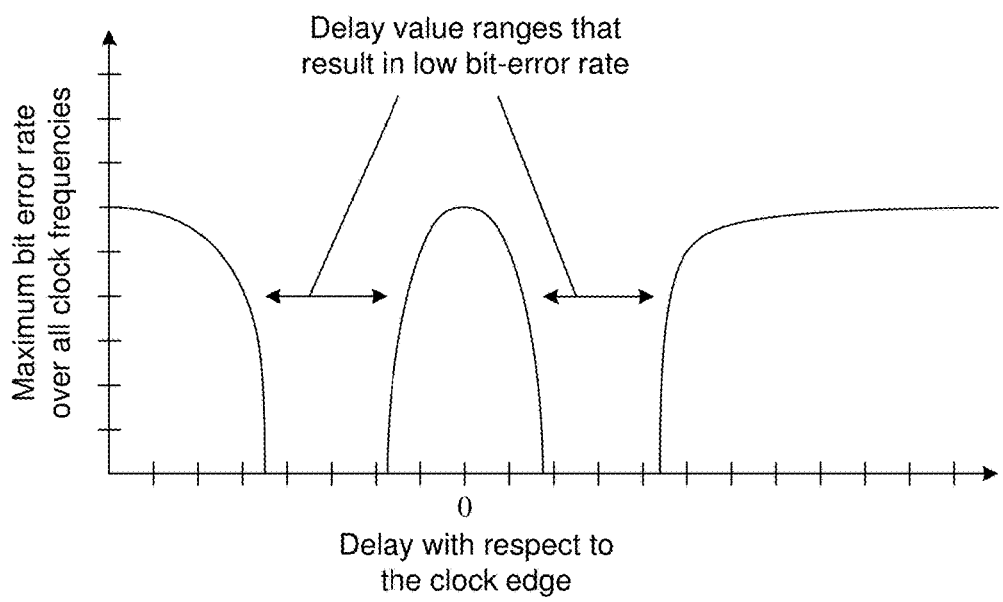
FIG. 3D illustrates a plot of the maximum bit-error rate over a range of clock frequencies versus the delay from the data bit edge in accordance with some embodiments described herein.

In some embodiments described herein, a sampling receiver is configured to sample the data signal with a fixed delay offset that guarantees a low bit-error rate over a wide range of clock frequencies. FIGS. 3B-3C illustrate plots of the bit-error rate for a low and a high clock frequency, respectively, versus the delay from the data bit edge in accordance with some embodiments described herein. FIG. 3D illustrates a plot of the maximum bit-error rate over a wide range of clock frequencies versus the delay from the data bit edge in accordance with some embodiments described herein. For a given delay value, the bit-error rate can be different for different clock frequencies. For example, as shown in FIGS. 3B-3C, delay δ corresponds to a low bit-error rate at a low clock frequency, but corresponds to a high bit-error rate at a high clock frequency.

As shown in FIG. 3D, there are certain delay value ranges that, without modification, result in a low bit-error rate over a wide range of clock frequencies. The bit-error rate plot shown in FIG. 3D can be thought of as the "OR" of the individual bit-error rate plots (e.g., the plots shown in FIGS. 3B-3C) for individual clock frequencies over the wide range of clock frequencies. Once these delay value ranges have been determined, the sampling receiver can be configured to sample the data bits using a delay that falls within these delay value ranges, thereby causing the sampling receiver to have a low bit-error rate across the wide range of frequencies.

Figure 3E:
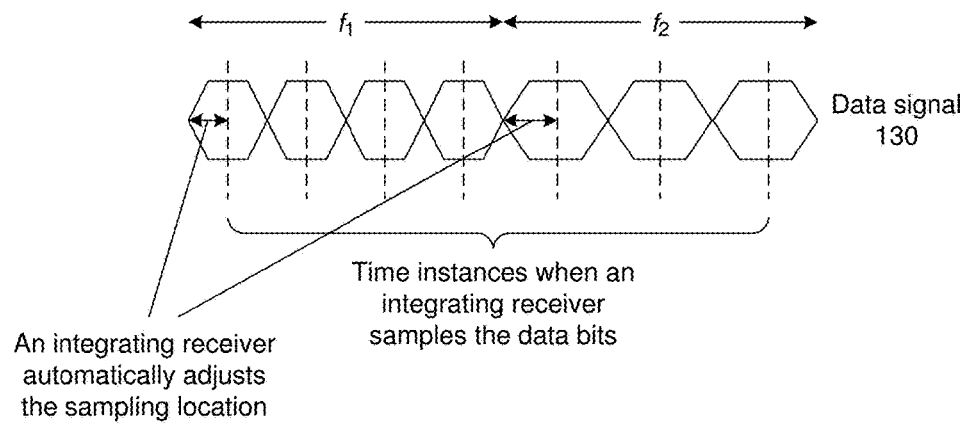
FIG. 3E illustrates a waveform that corresponds to an integrating receiver in accordance with some embodiments described herein.

FIG. 3E illustrates a waveform that corresponds to an integrating receiver in accordance with some embodiments described herein.

Of the seven data bits shown in FIG. 3E, the first four data bits of data signal 130 are timed according to clock frequency $f_1$, and the remaining three data bits are timed according to clock frequency $f_2$. The dashed vertical lines represent the time instances when the integrating receiver samples the data bits.

In some embodiments described herein, an integrating receiver automatically adjusts the sampling location as the clock frequency changes. For example, as shown in FIG. 3E, the center of the integration window is substantially in the middle of the data bit for the first four data bits, and it remains substantially in the middle of the data bit even after the clock frequency changes from $f_1$ to $f_2$. Since the integrating receiver is capable of adjusting the location of the integration window when the clock frequency changes, an integrating receiver has a low bit-error rate over all operating clock frequencies with margin that is centered on both sides and increases at lower frequencies.

Figure 3F:
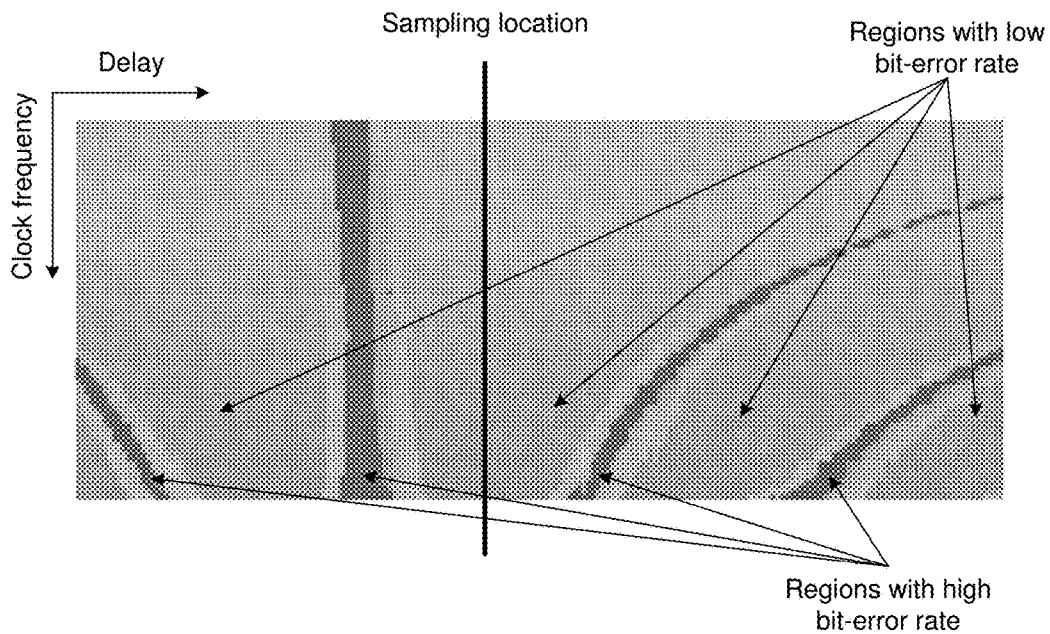
FIG. 3F illustrates the bit-error rate for a sampling receiver over a wide range of frequencies in accordance with some embodiments described herein.

FIG. 3F illustrates the bit-error rate for a sampling receiver over a wide range of frequencies in accordance with some embodiments described herein. The sampling location is illustrated using a bold line. The X-axis corresponds to the delay with respect to a clock edge. The Y-axis corresponds to the clock frequency, wherein the clock frequency increases from top to bottom (i.e., in the direction of the Y-axis arrow). The regions with different bit-error rates are shaded using different patterns. As can be seen from the figure, at lower frequencies the margin increases only on one side (the right side in FIG. 3F) of the sampling location.

Figure 3G:
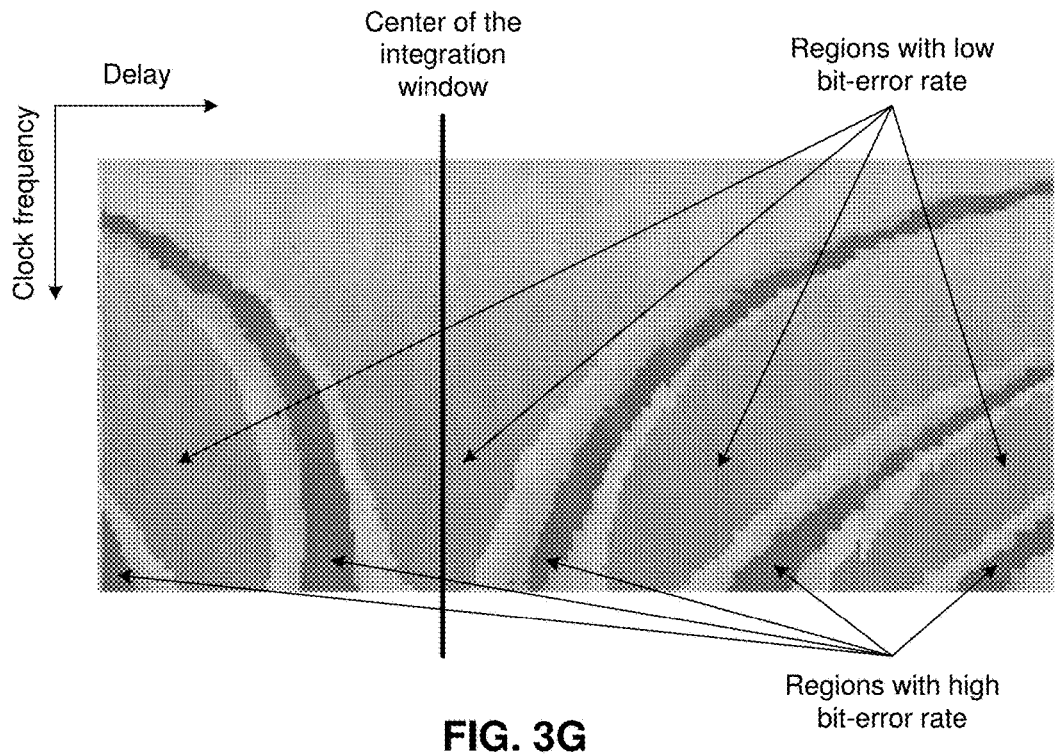
FIG. 3G illustrates the bit-error rate around the center of the integration window over a wide range of frequencies in accordance with some embodiments described herein.

FIG. 3G illustrates the bit-error rate around the center of the integration window over a wide range of frequencies in accordance with some embodiments described herein. The center of the integration window is illustrated using a bold line. The X-axis corresponds to the delay with respect to the center of the integration window of an integrating receiver. The Y-axis corresponds to the clock frequency, wherein the clock frequency increases from top to bottom (i.e., in the direction of the Y-axis arrow). The regions with different bit-error rates are shaded using different patterns. As can be seen from the figure, at lower frequencies the margin increases on both sides symmetrically around the center of the integrating window.

Circuitry 122 can determine a target clock frequency using a number of techniques. Some of these techniques are now described. In some embodiments, circuitry 122 changes the clock frequency depending on the type of memory command that is being performed. For example, for read commands, circuitry 122 changes (if necessary) the clock frequency to a sufficiently high value so that the requested data is returned to the agent within a desired amount of time. For example, if the agent is requesting data from memory 104 that corresponds to a video, then the video data needs to be provided within a certain amount of time to ensure that the video is displayed smoothly without any interruptions. On the other hand, for write commands, circuitry 122 changes (if necessary) the clock frequency to the lowest value possible while still maintaining desired performance without overflowing buffers to minimize power consumption of the memory system.

In some embodiments, circuitry 122 accesses command buffer 136 to determine whether or not command buffer 136 contains any read commands. If command buffer 136 contains read commands, then circuitry 122 changes the clock frequency to a sufficiently high value and processes the read commands first. Once all read commands in command buffer 136 have been processed, circuitry 122 decreases the clock frequency to a sufficiently low value and processes other commands (e.g., write commands) that are waiting in command buffer 136.

In some embodiments, circuitry 122 changes the clock frequency based solely or partially on a temperature value reported by a temperature sensor. For example, if the temperature value is greater than a first threshold, then circuitry 122 can decrease the clock frequency. On the other hand, if the temperature is less than a second threshold, then circuitry 122 can increase the clock frequency. In other embodiments the clock frequency is adjusted based solely or partially on a supply voltage (e.g., higher supply voltages may correspond to lower frequencies, and vice versa). In some embodiments both temperature and the supply voltage are used to adjust frequency. In some embodiments a critical path matching circuit is used and frequency is reduced until the critical path circuit delay matches the reduced frequency.

In some embodiments, circuitry 122 changes the clock frequency based on the current excess capacity of the command buffer (e.g., available space in the command buffer) and the current rate at which memory controller circuitry 102 is servicing commands. The circuitry 122 can adjust the clock frequency to prevent command buffer 136 from overflowing.

The above embodiments of circuitry 122 have been presented for illustration purposes only. Many variations and modifications will be apparent to those skilled in the art. For example, in some embodiments, the temperature reported by a temperature sensor can be used to determine an upper bound of a frequency range in which circuitry 122 is allowed to change the clock frequency. As an example, suppose circuitry 122 performs read operations at the maximum allowable clock frequency. When the temperature is less than a threshold, circuitry 122 may be allowed to increase the clock frequency to $f_{max}$, but if the temperature is greater than the threshold, then circuitry 122 may only be allowed to increase the clock frequency to $f_{max}/2$.

Figure 4:
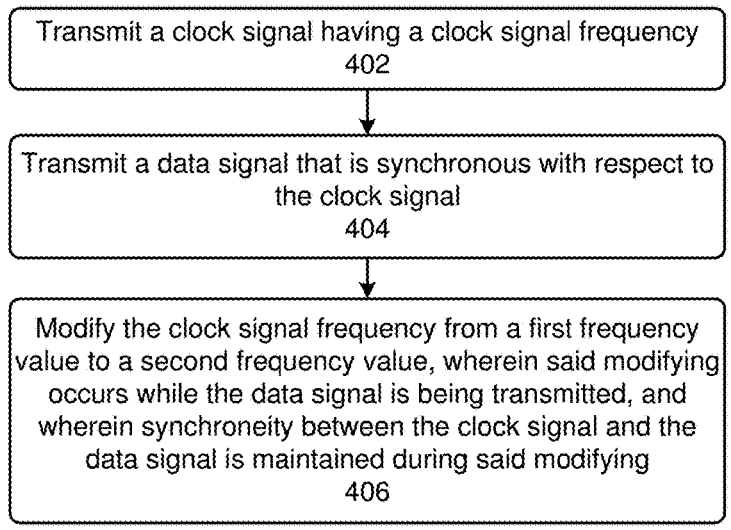
FIG. 4 illustrates a process for communicating information in accordance with some embodiments described herein.

FIG. 4 illustrates a process for communicating information in accordance with some embodiments described herein. The process begins by transmitting a clock signal having a clock signal frequency (operation 402). Next, a data signal is transmitted that is synchronous with respect to the clock signal (operation 404). Then, the clock signal frequency is modified from a first frequency value to a second frequency value, wherein said modifying occurs while the data signal is being transmitted, and wherein synchronicity between the clock signal and the data signal is maintained during said modifying (operation 406).

Figure 5:
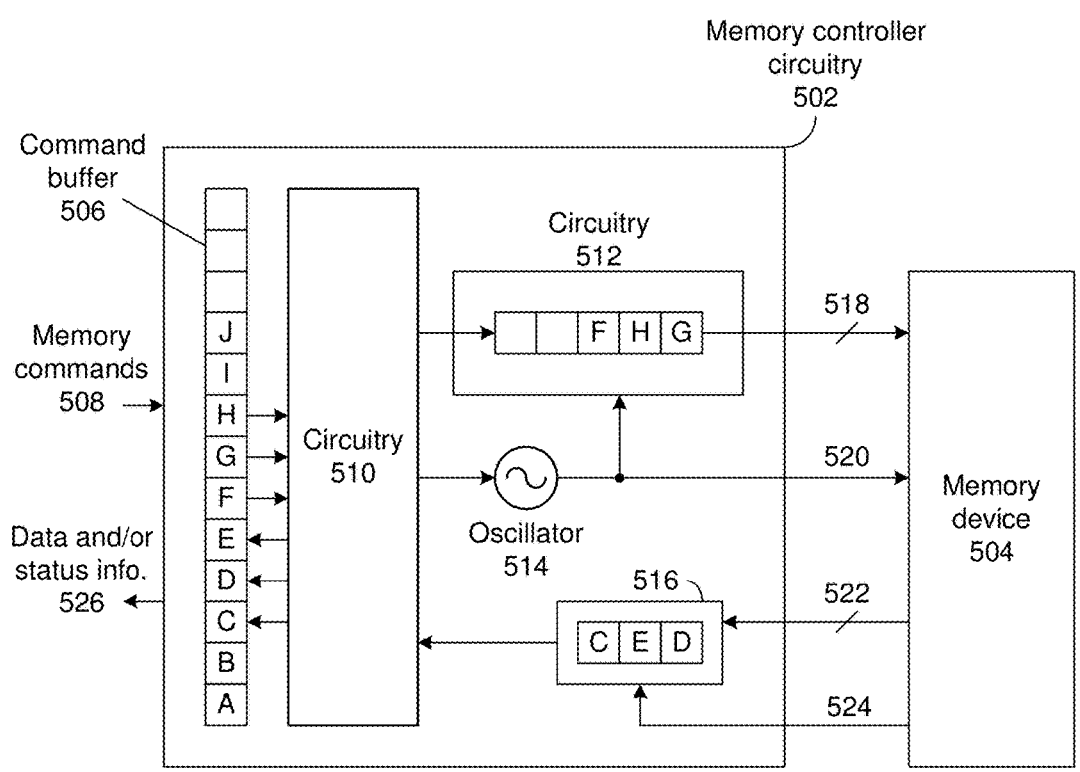
FIG. 5 illustrates an implementation of memory controller circuitry in accordance with some embodiments described herein.

FIG. 5 illustrates an implementation of memory controller circuitry in accordance with some embodiments described herein. Memory controller circuitry 502 communicates with memory device 504 over a set of signal lines. Memory controller circuitry 502 communicates information to memory device 502 using data signals 518 that are clocked according to clock signal 520. Memory device 504 communicates information to memory controller circuitry 502 using data signals 522 that are clocked according to clock signal 524.

Memory commands 508 are received from one or more agents and are stored in memory buffer 506. Data and/or status information 526 is sent back to one or more agents upon completing execution of memory commands 508. Circuitry 510 determines an order in which to send memory commands 508 to memory device 504. In some embodiments, circuitry 510 may send all memory read commands in command buffer 506 to memory device 504 before sending any memory write commands. Circuitry 510 provides memory commands 508 in the appropriate order to circuitry 512, which then sends the memory command in the given order to memory device 504 using clock signal 520.

Circuitry 510 determines the clock frequency to use for sending the memory commands to memory device 504. Specifically, circuitry 510 controls the settings of oscillator 514 to generate clock signal 520 that has the desired clock frequency. In some embodiments, circuitry 510 determines the clock frequency based on one or more of the following factors: the number of read commands in command buffer 506, the number of write commands in command buffer 506, and the available space in command buffer 506. For example, the available space in the command buffer 506 is equal to five slots (the three empty slots shown at the top and the bottom two slots that contain memory commands A and B which have been completed).

An example of how memory commands may be reordered is shown in FIG. 5. Memory commands A-J were received in alphabetical order and are stored in command buffer 506 in the order in which they were received. Circuitry 510 then reordered commands F, G, and H as follows: G, H, and F. Next, circuitry 510 provided the reordered commands to circuitry 512 to send them to memory device 504. Memory device 504 returned the results of executing commands C, E, and D (note that these commands were also reordered by circuitry 510), which are stored in buffer 516. The returned results can then be sent to the appropriate agent(s) as data and/or status information 526.

Figure 6A:
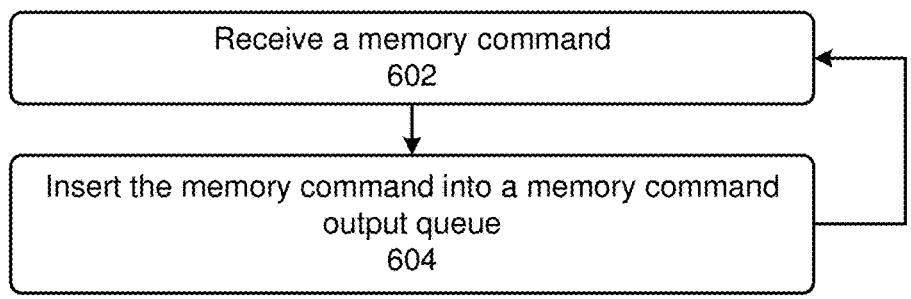
FIGS. 6A-6C present flowcharts that illustrate processes that can be concurrently and independently performed by the memory controller circuitry in accordance with some embodiments described herein.
Figure 6B:
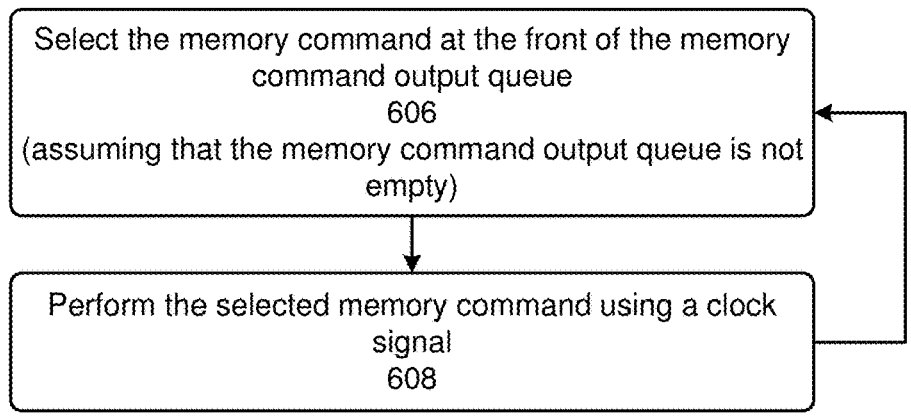
Figure 6C:
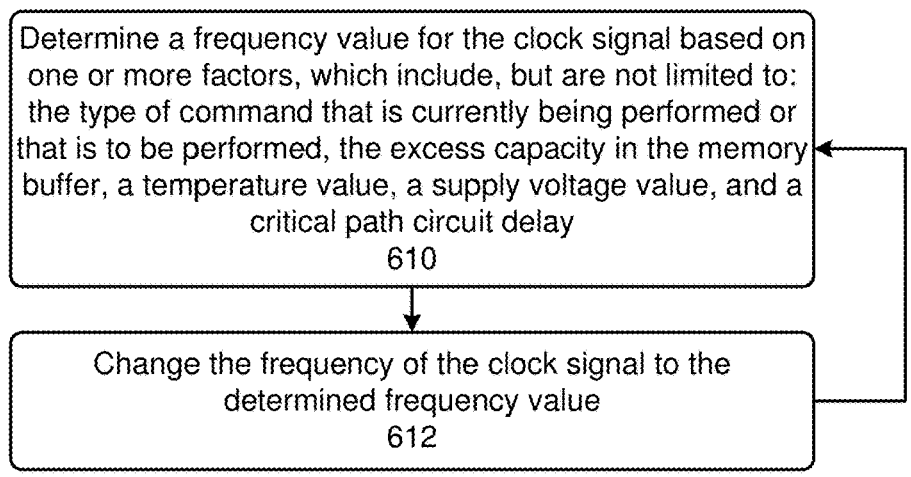

FIGS. 6A-6C present flowcharts that illustrate processes that can be concurrently and independently performed by the memory controller circuitry in accordance with some embodiments described herein. Furthermore, the processes shown in FIGS. 6A-6C can each be performed continuously (e.g., in a loop). The process illustrated in FIG. 6A comprises receiving a memory command (operation 602), and inserting the memory command into a memory command output queue (operation 604). For example, in FIG. 5, circuitry 510 can receive a memory command from command buffer 506, and insert the memory command into a memory command output queue in circuitry 512. The memory controller circuitry can reorder commands by inserting memory commands into the memory command output queue using a queuing discipline that is different from first-in-first-out. Specifically, in some embodiments, the memory command output queue can be a priority queue, and the memory controller circuitry can assign read commands a higher priority value than write commands. In this embodiment, read commands would be performed before write commands.

The process illustrated in FIG. 6B begins by selecting the memory command at the front of the memory command output queue (operation 606). Note that operation 606 assumes that the memory command output queue is not empty. If the memory command output queue is empty, then this process is not performed. Next, the memory controller circuitry can perform the selected memory command using a clock signal (operation 608).

The process illustrated in FIG. 6C begins by determining a frequency value for the clock signal based on one or more factors, which include, but are not limited to: the type of command (e.g., read or write) that is currently being performed or that is to be performed, the excess capacity in the memory buffer, a temperature value, a supply voltage value, and a critical path circuit delay (operation 610). Next, the memory controller circuitry can change the frequency of the clock signal to the determined frequency value (operation 612).

The methods and/or processes that have been implicitly or explicitly described in this disclosure can be embodied in hardware, software, or a combination thereof. Hardware embodiments include, but are not limited to, IC chips, field-programmable gate arrays (FPGAs), system-on-chips (SoCs), application specific integrated circuits (ASICs), etc.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. A method, comprising:
receiving, at a memory controller, memory commands in a first sequence order;
determining, by the memory controller, a second sequence order for sending the memory commands to a memory device;
determining, by the memory controller, a frequency of a clock signal for sending the memory commands to the memory device; and
sending, by the memory controller, the memory commands to the memory device in the second sequence order by using the clock signal.

2. The method of claim 1, wherein said determining, by the memory controller, the second sequence order for sending the memory commands to the memory device comprises reordering the memory commands so that read commands are sent before write commands.

3. The method of claim 1, wherein said determining, by the memory controller, the frequency of the clock signal for sending the memory commands to the memory device comprises determining the frequency based on a type of at least one memory command in the memory commands.

4. The method of claim 1, wherein said determining, by the memory controller, the frequency of the clock signal for sending the memory commands to the memory device comprises determining the frequency based on an excess capacity in a memory buffer that stores the memory commands in the first sequence order.

5. The method of claim 1, wherein said determining, by the memory controller, the frequency of the clock signal for sending the memory commands to the memory device comprises determining the frequency based on a temperature value.

6. The method of claim 1, wherein said determining, by the memory controller, the frequency of the clock signal for sending the memory commands to the memory device comprises determining the frequency based on a supply voltage value.

7. The method of claim 1, further comprising:
storing, in a first memory buffer, the memory commands in the first sequence order; and
storing, in a second memory buffer, the memory commands in the second sequence order.

8. An integrated circuit (IC), comprising:
a first circuit to receive memory commands in a first sequence order;
a second circuit to determine a second sequence order for sending the memory commands to a memory device;
a third circuit to determine a frequency of a clock signal for sending the memory commands to the memory device; and
a fourth circuit to send the memory commands to the memory device in the second sequence order by using the clock signal.

9. The IC of claim 8, wherein the second circuit reorders the memory commands so that read commands are sent before write commands.

10. The IC of claim 8, wherein the third circuit determines the frequency based on a type of at least one memory command in the memory commands.

11. The IC of claim 8, wherein the third circuit determines the frequency based on an excess capacity in a memory buffer that stores the memory commands in the first sequence order.

12. The IC of claim 8, wherein the third circuit determines the frequency based on a temperature value.

13. The IC of claim 8, wherein the third circuit determines the frequency based on a supply voltage value.

14. The IC of claim 8, comprising:
a fifth circuit to store the memory commands in the first sequence order; and
a sixth circuit to store the memory commands in the second sequence order.

15. A memory controller, comprising:
an oscillator to generate a clock signal;
a first circuit to receive memory commands in a first sequence order;
a first memory buffer to store the memory commands in the first sequence order;
a second circuit to determine a second sequence order for sending the memory commands to a memory device;
a second memory buffer to store the memory commands in the second sequence order;
a third circuit to determine a frequency of the clock signal for sending the memory commands to the memory device;
a fourth circuit to change one or more settings of the oscillator based on the frequency determined by the third circuit; and
a fifth circuit to send the memory commands to the memory device in the second sequence order by using the clock signal.

16. The memory controller of claim 15, wherein the second circuit reorders the memory commands so that read commands are sent before write commands.

17. The memory controller of claim 15, wherein the third circuit determines the frequency based on a type of at least one memory command in the memory commands.

18. The memory controller of claim 15, wherein the third circuit determines the frequency based on an excess capacity in the first memory buffer.

19. The memory controller of claim 15, wherein the third circuit determines the frequency based on a temperature value.

20. The memory controller of claim 15, wherein the third circuit determines the frequency based on a supply voltage value.

* * * * *